(12) United States Patent
Chang et al.

(10) Patent No.: US 11,950,411 B2
(45) Date of Patent: Apr. 2, 2024

(54) SEMICONDUCTOR MEMORY DEVICES WITH DIELECTRIC FIN STRUCTURES

(71) Applicant: Taiwan Semiconductor Manufacturing Company, Ltd., Hsinchu (TW)

(72) Inventors: Meng-Sheng Chang, Chu-bei (TW); Chia-En Huang, Xinfeng Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 290 days.

(21) Appl. No.: 17/473,636

(22) Filed: Sep. 13, 2021

(65) Prior Publication Data

US 2022/0352186 A1    Nov. 3, 2022

Related U.S. Application Data

(60) Provisional application No. 63/181,463, filed on Apr. 29, 2021.

(51) Int. Cl.
*H01L 27/112*     (2006.01)
*H01L 29/06*      (2006.01)
*H10B 20/20*      (2023.01)

(52) U.S. Cl.
CPC ......... *H10B 20/20* (2023.02); *H01L 29/0665* (2013.01)

(58) Field of Classification Search
CPC ......... H01L 21/02603; H01L 21/76224; H01L 21/823431; H01L 21/823481; H01L 21/823821; H01L 21/823878; H01L 21/845; H01L 27/0886; H01L 27/0924; H01L 27/1211; H01L 29/0649; H01L 29/0665; H01L 29/0669; H01L 29/0673; H01L 29/41791; H01L 29/42392; H01L 29/66439; H01L 29/66545; H01L 29/66795; H01L 29/775; H01L 29/785; H01L 29/7851; H01L 29/7853; H01L 29/7855; H01L 2029/7858; H10B 20/20
See application file for complete search history.

(56) References Cited

U.S. PATENT DOCUMENTS

| | | | |
|---|---|---|---|
| 11,031,292 B2 * | 6/2021 | Ju | H01L 27/0886 |
| 2020/0105761 A1 * | 4/2020 | Liaw | H01L 29/785 |
| 2020/0343342 A1 * | 10/2020 | Xie | H01L 29/16 |

(Continued)

*Primary Examiner* — David C Spalla
(74) *Attorney, Agent, or Firm* — FOLEY & LARDNER LLP

(57) ABSTRACT

A semiconductor device includes a plurality of first nanostructures extending along a first lateral direction. The semiconductor device includes a first epitaxial structure and second epitaxial structure respectively coupled to ends of each of the plurality of first nanostructures along the first lateral direction. The semiconductor device includes a dielectric fin structure disposed immediately next to a sidewall of each of the plurality of first nanostructures facing a second lateral direction perpendicular to the first lateral direction. The semiconductor device includes a first gate structure wrapping around each of the plurality of first nanostructures except for the sidewalls of the first nanostructures. The semiconductor device includes a metal structure disposed above the first gate structure and coupled to one of the first or second epitaxial structure.

20 Claims, 9 Drawing Sheets

(56) References Cited

U.S. PATENT DOCUMENTS

| | | | |
|---|---|---|---|
| 2021/0220644 A1* | 7/2021 | Simon | A61N 1/36034 |
| 2021/0343600 A1* | 11/2021 | Chen | H01L 27/092 |
| 2022/0399336 A1* | 12/2022 | Guler | H01L 29/7851 |
| 2022/0399373 A1* | 12/2022 | Guler | H01L 27/088 |
| 2023/0260849 A1* | 8/2023 | Chen | H01L 27/092 |
| | | | 257/351 |
| 2023/0260998 A1* | 8/2023 | Ju | H01L 21/823871 |
| | | | 257/351 |

* cited by examiner

SEMICONDUCTOR MEMORY DEVICES WITH DIELECTRIC FIN STRUCTURES

CROSS-REFERENCE TO RELATED APPLICATION

This application claims priority to and the benefit of U.S. Provisional Application No. 63/181,463, filed Apr. 29, 2021, entitled "A NOVEL EFUSE STRUCTURE WITH FORK-NANOSHEET PROCESS," which is incorporated herein by reference in its entirety for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
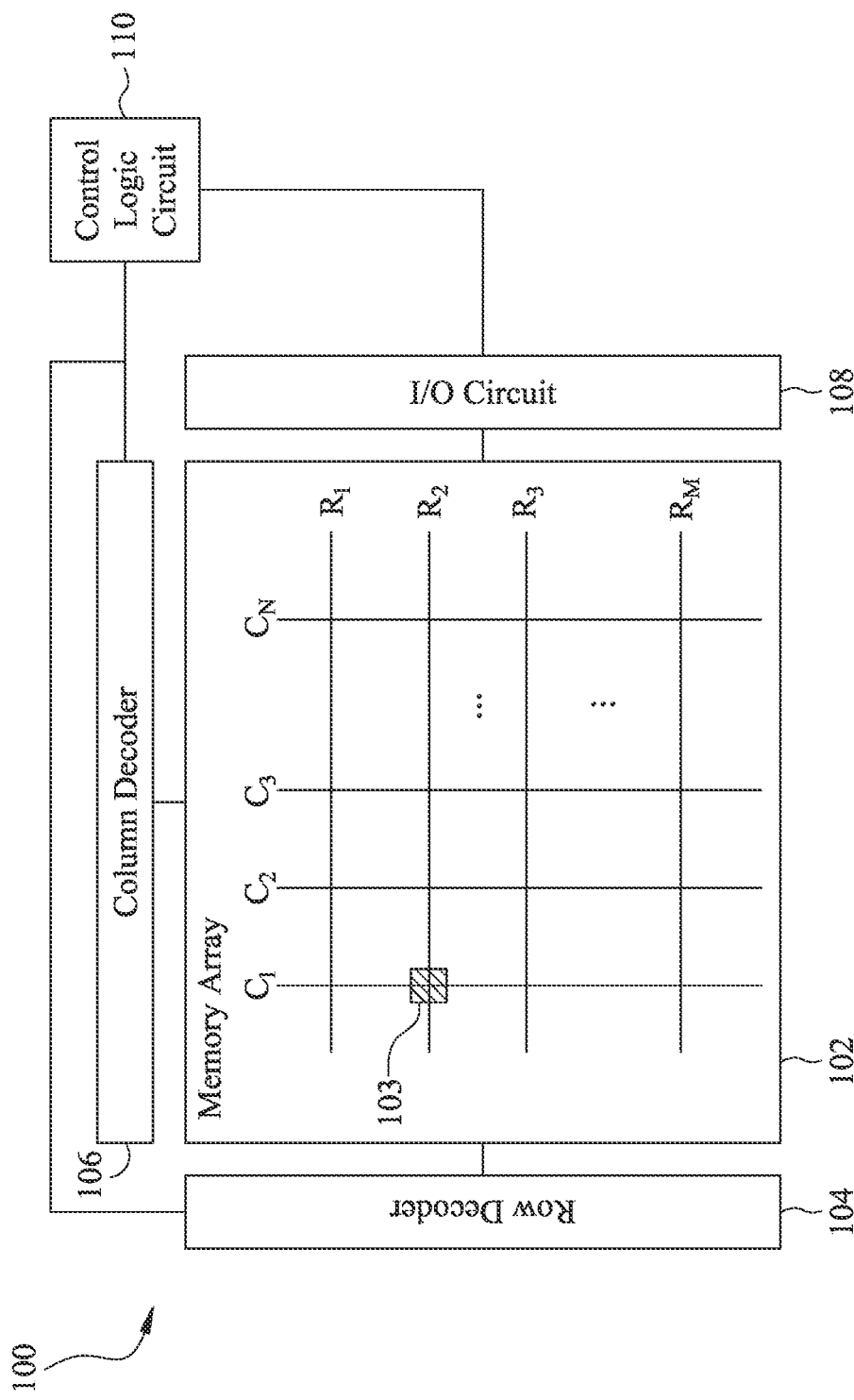
FIG. 1 illustrates a block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-time-programmable (OTP) memory device is one type of the non-volatile memory device utilized in integrated circuits for adjusting the circuitry after fabrication of an integrated circuit. For example, the OTP memory device is used for providing repair information that controls the usage of redundant cells in replacing defective cells of a memory array. Another use is for tuning analog circuitry by trimming a capacitive or resistive value of an analog circuit or enabling and disabling portions of the system. A recent trend is that the same product is likely to be manufactured in different fabrication facilities though in a common process technology. Despite best engineering efforts, it is likely that each facility will have a slightly different process. Usage of OTP memory devices allows independent optimization of the product functionality for each manufacturing facility.

As integrated circuit technology advances, integrated circuit features (e.g., transistor gate length) have been decreasing, thereby allowing for more circuitry to be implemented in an integrated circuit. One challenge with implementing OTP memory devices such as, for example, a fuse, an electronic fuse (efuse), etc., in an integrated circuit is that efuse size reduction has not advanced at nearly the same rate as the reduction in size of transistor features. Accordingly, efuses may require a greater relative portion of the integrated circuit as integrated circuit technology advances.

The present disclosure provides various embodiments of an efuse device that includes a number of efuse cells formed as an array. Each of the efuse cells may include a resistor (sometimes referred to as a fuse resistor) and a transistor (sometimes referred to as an access transistor) electrically coupled to each other in series. Access of each efuse cell is controlled by the corresponding access transistor, which may can be constructed by operatively connecting a number of sub-transistors in parallel. According to various embodiments of the present disclosure, at least some of the sub-transistors across the array can be fabricated in a fork configuration. For example, a dielectric fin structure can be interposed between a first set of nanostructures and a second set of nanostructures, which can function as the (conduction) channels of a first sub-transistor and a second sub-transistor, respectively. With the access transistors (and their respective sub-transistors) formed in such a fork configuration, advantageously, an area of the array can be significantly decreased, which allows more of the disclosed efuse cells to be formed in a given real estate of an integrated circuit. In contrast with the existing efuse technologies, the channels of different access transistors (or their respective sub-transistors) are typically formed in respective active regions. Such active regions are required to be separated apart with a minimum spacing, given various design rule limitations. As such, the existing efuse memory device occupies a significantly greater amount of real estate than the disclosed efuse memory device, which can make it challenging to integrate the existing efuse memory device into an integrated circuit that continues to evolve with advanced technologies.

FIG. 1 illustrates a memory device 100, in accordance with various embodiments. In the illustrated embodiment of FIG. 1, the memory device 100 includes a memory array 102, a row decoder 104, a column decoder 106, an input/output (I/O) circuit 108, and a control logic circuit 110. Despite not being shown in FIG. 1, the components of the memory device 100 may be operatively coupled to each other and to the control logic circuit 112. Although, in the illustrated embodiment of FIG. 1, each component is shown as a separate block for the purpose of clear illustration, in some other embodiments, some or all of the components shown in FIG. 1 may be integrated together. For example, the memory array 102 may include an embedded I/O circuit 108.

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1, R_2, R_3 \ldots R_M$, each extending in a first direction (e.g., X-direction) and a number of columns $C_1, C_2, C_3 \ldots C_N$, each extending in a second direction (e.g., Y-direction). Each of the rows/columns may include one or more conductive structures. In some embodiments, each memory cell 103 is arranged in the intersection of a corresponding row and a corresponding column and can be operated according to voltages or currents through the respective conductive structures of the column and row.

In accordance with various embodiments of the present disclosure, each memory cell 103 is implemented as an efuse cell that includes a fuse resistor and a access transistor coupled in series. The access transistor can be coupled to (e.g., gated by) a WL. The access transistor can be turned on/off to enable/disable an access (e.g., program, read) to the corresponding fuse resistor. For example, upon being selected, the access transistor of the selected fuse cell is turned on to generate a program or read path conducting through its fuse resistor and itself. Detailed descriptions on configurations of the memory cell 103 will be discussed below with respect to FIG. 2.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a bit line, a source line) at that column address. The I/O circuit 108 is a hardware component that can access (e.g., read, program) each of the memory cells 103 asserted through the row decoder 104 and column decoder 106. The control logic circuit 110 is a hardware component that can control the coupled components (e.g., 102 through 108). Detailed descriptions on operations of the memory device 100 are provided below with respect to FIG. 4.

Figure 2:
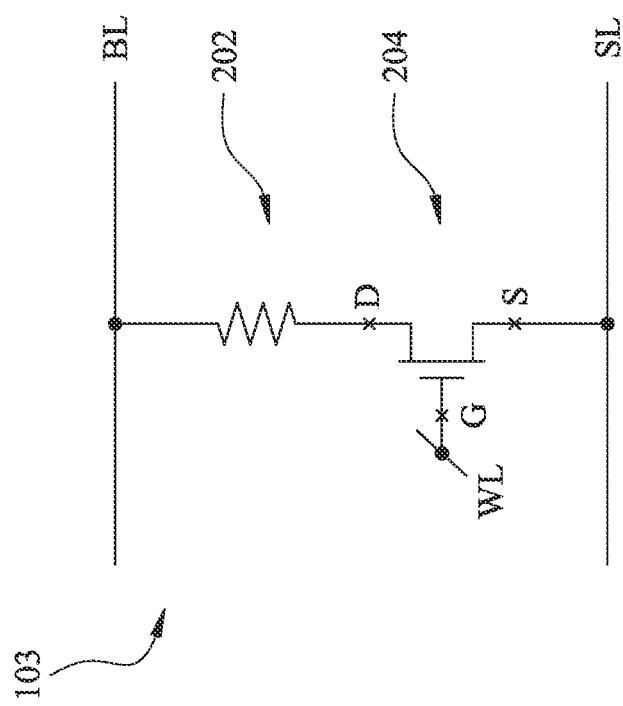
FIG. 2 illustrates an example circuit diagram of a memory cell of the memory device of FIG. 1, in accordance with some embodiments.

FIG. 2 illustrates an example configuration of the efuse cell 103 (FIG. 1), in accordance with some embodiments. The efuse cell 103 is implemented as a 1T1R configuration, for example, a fuse resistor 202 serially connected to an access transistor 204. It, however, should be understood that any of various other fuse configurations that exhibit the fuse characteristic may be used by the efuse cell 103 such as, for example, a 2-diodes-1-resistor (2D1R) configuration, a many-transistors-one-resistor (manyT1R) configuration, etc., while remaining within the scope of the present disclosure.

In accordance with various embodiments of the present disclosure, the fuse resistor 202 is formed of one or more metal structures. For example, the fuse resistor 202 may be one of a number of interconnect structures in one of a number metallization layers that are disposed above the access transistor 204. Specifically, the access transistor 204 is formed over a major surface of a semiconductor substrate, which is sometimes referred to as part of front-end-of-line (FEOL) processing. Over the FEOL processing, a number of metallization layers, each of which includes a number of interconnect (e.g., metal) structures, are typically formed, which are sometimes referred to as part of back-end-of-line (BEOL) processing.

With the fuse resistor 202 (of the efuse cell 103) embodied as a metal structure, the fuse resistor 202 may present an initial resistance value (or resistivity), for example, as fabricated. To program the efuse cell 103, the access transistor 204 (if embodied as an n-type transistor) is turned on by applying a (e.g., voltage) signal, corresponding to a logic high state, through a word line (WL) to a gate terminal of the access transistor 204. Concurrently or subsequently, a high enough (e.g., voltage) signal is applied on one of the terminals of the fuse resistor 202 through a bit line (BL). With the access transistor 204 turned on to provide a (e.g., program) path from the BL, through the resistor 202 and transistor 204, and to a source line (SL), such a high voltage signal can burn out a portion of the corresponding metal structure (the fuse resistor 202), thereby transitioning the fuse resistor 202 from a first state (e.g., a short circuit) to a second state (e.g., an open circuit). Accordingly, the efuse cell 103 can irreversibly transition from a first logic state (e.g., logic 0) to a second logic state (e.g., logic 1), which can be read out by applying a relatively low voltage signal on the BL and turning on the access transistor 204 to provide a (e.g., read) path.

Figure 3:
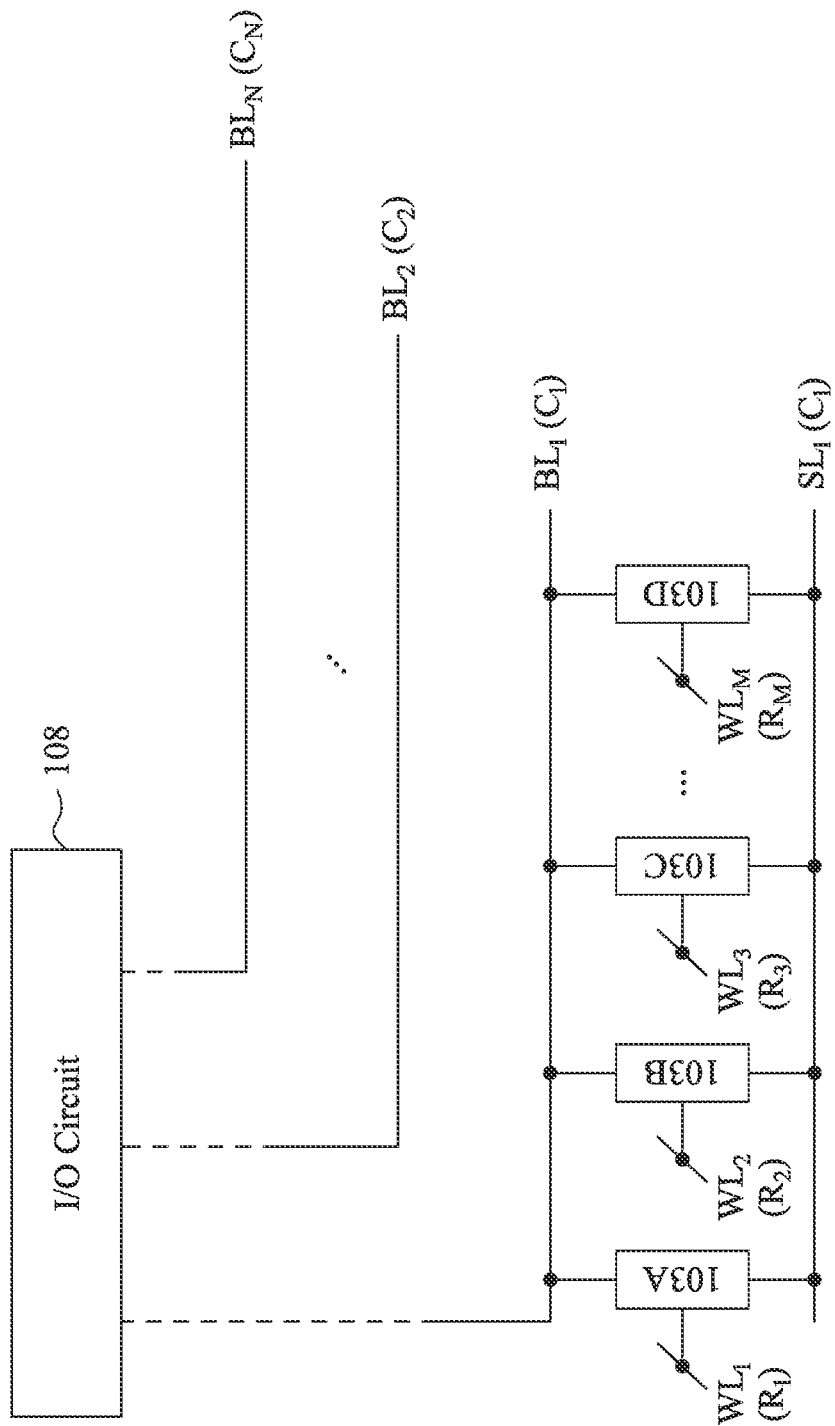
FIG. 3 illustrates a circuit diagram of a memory array of the memory device of FIG. 1, in accordance with some embodiments.

FIG. 3 illustrates an example circuit diagram of a portion of the memory device 100 (FIG. 1), in accordance with various embodiments. In the illustrated example of FIG. 3, four efuse cells, 103A, 103B, 103C, and 103D, of the memory array 102 are shown. Each of the cells 103A-D is substantially similar to the efuse cell 103 discussed with respect to FIG. 2. Although four efuse cells are shown, it should be appreciated that the memory array 102 can have any number of efuse cells, while remaining within the scope of present disclosure.

As mentioned above with respect to FIG. 1, the efuse cells 103 of the memory array 102 are formed as an array, in which the efuse cells are arranged over a number of columns and a number of rows. For example, a subset of the efuse cells is arranged along one of the rows, and each of the subset of efuse cells is arranged along a respective column. Alternatively stated, each of the efuse cells is arranged at the intersection of a column and a row. As shown in the example of FIG. 3, the efuse cell 103A is arranged at the intersection of column $C_1$ and row $R_1$; the efuse cell 103B is arranged at the intersection of column $C_1$ and row $R_2$; the RRAM cell 103C is arranged at the intersection of column $C_1$ and row $R_3$; and the efuse cell 103D is arranged at the intersection of column $C_1$ and row $R_M$. The column $C_1$ includes a first bit line $BL_1$ and a first source line $SL_1$, while the other columns ($C_2 \ldots C_N$) each include its respective BL ($BL_2, BL_N$) and SL (not shown). The row $R_1$ includes a word line $WL_1$; the row $R_2$ includes a word line $WL_2$; the row $R_3$ includes a word line $WL_3$; and the row $R_M$ includes a word line $WL_M$.

It should be noted that the bit lines and source lines are not necessarily disposed in the column of a memory array, neither are the word lines disposed in the row of a memory array. For example, in some other embodiments, the bit line and source line may be disposed along a corresponding one of a number of rows of a memory array and the word line may be disposed along a corresponding one of a number of columns of the same memory array, while remaining within the scope of present disclosure.

Referring still to FIG. 3, each of the efuse cells 103 is operatively coupled to the I/O circuit 108 through a corresponding one of the BLs. In various embodiments, the I/O circuit 108 includes at least a program circuit and a read circuit that can respectively program and read each of the efuse cells 103 through the respective BL, which will be discussed in FIG. 4 as follows.

Figure 4:
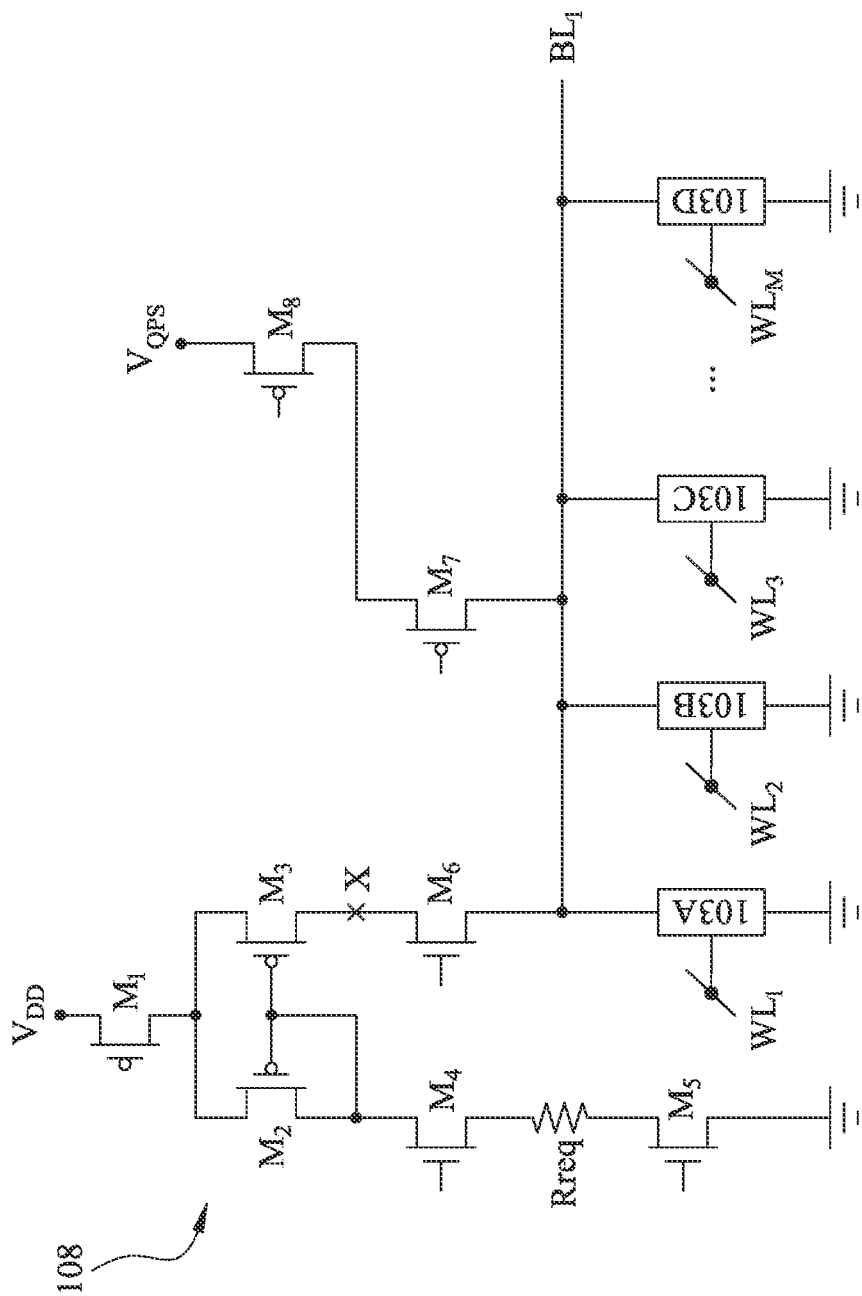
FIG. 4 illustrates a circuit diagram of an input/output (I/O) circuit of the memory device of FIG. 1, in accordance with some embodiments.

FIG. 4 illustrates an example circuit diagram of the I/O circuit 108 coupled to the RRAM cells 103A-D through $BL_1$, in accordance with various embodiments. It should be understood that the circuit diagram of the I/O circuit 108 shown in FIG. 4 is simplified for illustration purposes, and thus, the I/O circuit 108 can include any of various other components, while remaining within the scope of present disclosure.

As shown in FIG. 4, the I/O circuit 108 includes a number of transistors, M1, M2, M3, M4, M5, M6, M7, and M8; and a reference resistor, Rref. Most of the transistors of the I/O circuit 108 may be operated under supply voltages, VDD and ground. In some embodiments, the transistors M1, M2, M3, M7, and M8 may each be implemented as a p-type transistor; and the transistors M4, M5, and M6 may each be implemented as an n-type transistor. Further, the transistors M7 and M8 may function at least as a portion of a program circuit configured to program a selected one of the efuse cells 103A-D; and the transistors M1 to M6 may function at least as a portion of a read circuit to read a selected one of the efuse cells 103A-D. Specifically, the transistor M6 may function as a multiplexer or pass transistor to allow the read circuit to access the efuse cells disposed along a certain BL (e.g., 103A-D along $BL_1$); and the transistor M7 may function as a multiplexer or pass transistor to allow the program circuit to access the efuse cells disposed along a certain BL (e.g., 103A-D along $BL_1$). Thus, it should be appreciated that the I/O circuit 108 can include additional transistors M6 and M7 in accordance with the number of BLs to which the I/O circuit 108 is operatively connected.

To program a selected one of the efuse cells 103A-D (e.g., 103A), $BL_1$ is asserted and $WL_1$ is asserted, while the rest of the WLs are deasserted. The transistor M6 is turned off (e.g., by applying a logic low signal to its gate terminal), thereby disconnecting the read circuit from the efuse cells along $BL_1$. On the other hand, the transistors M7 and M8 are turned on (e.g., by applying a logic low signal to their gate terminals), thereby connecting the program circuit to the efuse cells along $BL_1$. Upon being turned on, the transistors M7 and M8 (the program circuit) can propagate a program voltage, VQPS, to the selected efuse cell 103A through $BL_1$, while not propagating the program voltage to the unselected efuse cells, e.g., 103B-D.

To read a selected one of the efuse cells 103A-D (e.g., 103A), $BL_1$ is asserted and $WL_1$ is asserted, while the rest of the WLs are deasserted. The transistor M6 is turned on (e.g., by applying a logic high signal to its gate terminal), thereby connecting the read circuit to the efuse cells along $BL_1$. On the other hand, the transistors M7 and M8 are turned off (e.g., by applying a logic high signal to their gate terminals), thereby disconnecting the program circuit from the efuse cells along $BL_1$. When the transistor M6 is turned on, the transistors M1 to M5 are also turned on. The reference resistor Rref can function as a reference to be compared with a resistance value of the selected efuse cell, thereby allowing a logic state to be present at node X.

For example, if the resistor of the selected efuse cell 103A is in a low resistance state (e.g., not programmed yet), a current conducting through the reference resistor Rref can be mirrored from a first current path, flowing through the transistors M2, M4, and M5 to ground, to a second current path, flowing through the transistors M3 and M6, the selected efuse cell 103A, and to ground. As such, a voltage level at node X is pulled down to ground, which can correspond to a first logic state (e.g., logic 0). If the resistor of the selected efuse cell 103A is in a high resistance state (e.g., already programmed), a current conducting through the reference resistor Rref can be mirrored from the same first current path to the same second current path, but not to ground as the resistor of the efuse cell 103A presents an open circuit. As such, a voltage level at node X cannot be pulled down to ground. Instead, the voltage level at node X may remain at about VDD, which can correspond to a second logic state (e.g., logic 1).

Figure 5:
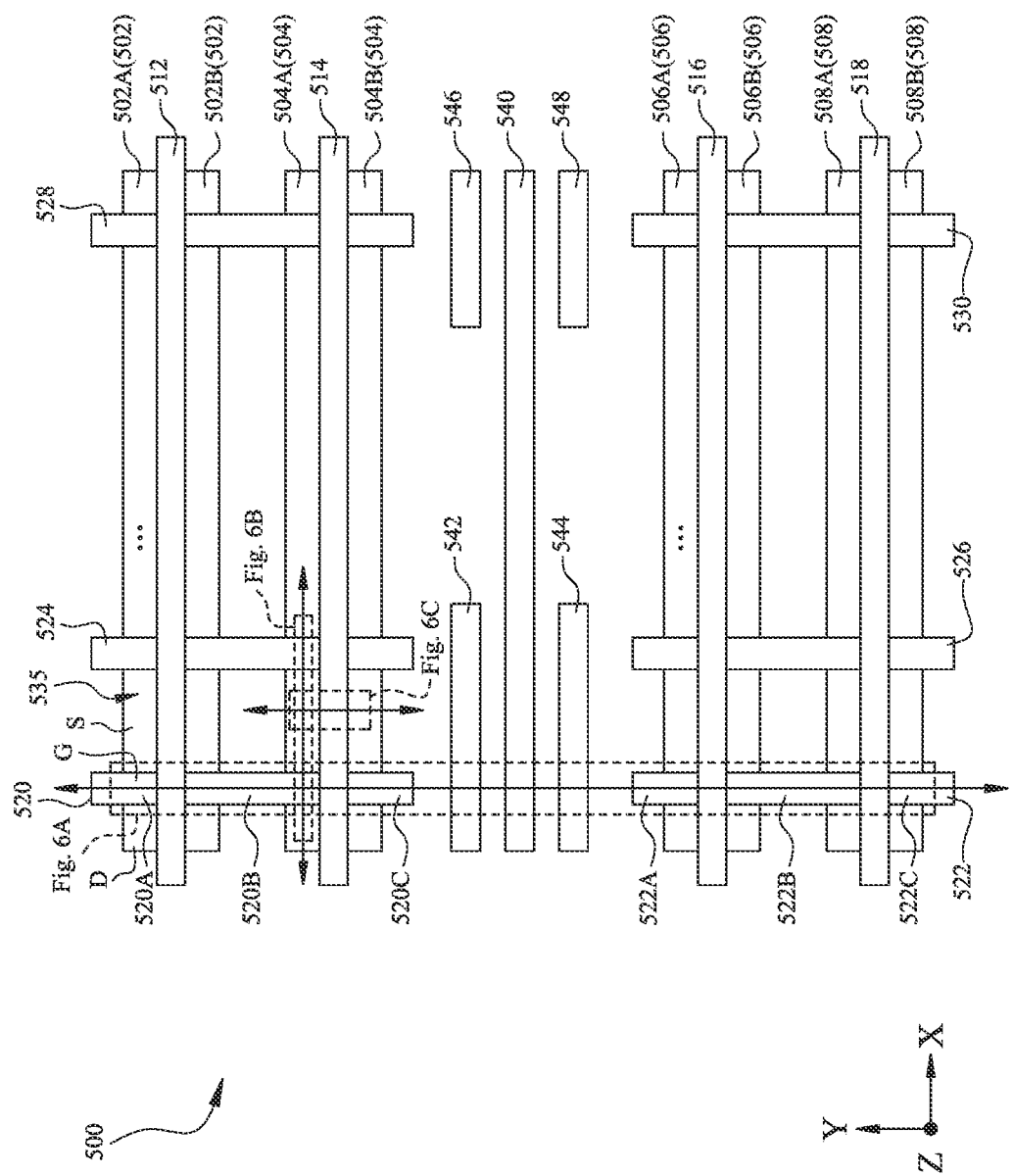
FIG. 5 illustrates an example layout to fabricate one memory cell of the memory device of FIG. 1, in accordance with some embodiments.

FIG. 5 illustrates an example layout 500 of one of the disclosed efuse cells (e.g., 103), in accordance with various embodiments. As mentioned above, the efuse cell, as disclosed herein, is formed of an access transistor and a fuse resistor coupled in series. The access transistor can be constructed by a number (e.g., 100) of sub-transistors, each of which is coupled to one another in parallel; and the fuse resistor can be constructed by a metal structure disposed above those sub-transistors.

Specifically, each of the sub-transistors has a channel structure constituted by a number of nanostructures (e.g., nanosheets, nanowires, nanobridges), with one of their sidewalls coupled to a dielectric fin structure, in accordance with various embodiments of present disclosure. Such a combination of the dielectric fin structure and the plural nanostructures may sometimes be referred to as a fork nanosheet configuration. With the fork nanosheet configuration, an area to form such a relatively large number of sub-transistors can be significantly reduced (e.g., at least 20% less when compared to the configuration that does not adopt the fork nanosheet configuration). Although the current disclosure is directed to forming the channel structure as a combination of discrete nanostructures, it should be understood that the channel structure of the sub-transistor of the disclosed efuse cell 103 can be formed as integral one-piece structure (e.g., a semiconductor fin structure), while remaining within the scope of present disclosure.

As shown in FIG. 5, the layout 500 includes patterns 502, 504, 506, and 508 that are each configured to form an active region (hereinafter "active region 502," "active region 504," "active region 506," and "active region 508," respectively); patterns 512, 514, 516, and 518 that are each configured to form a dielectric fin structure (hereinafter "dielectric fin structure 512," "dielectric fin structure 514," "dielectric fin structure 516," and "dielectric fin structure 518," respectively); and patterns 520, 522, 524, 526, 528, and 530 that are each configured to form a gate structure (hereinafter "gate structure 520," "gate structure 522," "gate structure 524," "gate structure 526," "gate structure 528," and "gate structure 530," respectively).

The active regions 504 to 508 may extend along a first lateral direction (e.g., X-direction) and the dielectric fin structures 512 to 518 may also extend along the same direction, while the gate structures 520 to 530 may extend along a second, different lateral direction (e.g., Y-direction). Further, each of the dielectric fin structures extends across a corresponding one of the active regions, thereby separating each active region into two portions along the Y-direction. For example, the dielectric fin structure 512 separates the active region 502 into two portions 502A and 502B; the dielectric fin structure 514 separates the active region 504 into two portions 504A and 504B; the dielectric fin structure 516 separates the active region 506 into two portions 506A and 506B; and the dielectric fin structure 518 separates the active region 508 into two portions 508A and 502B. Still further, the dielectric fin structures 512 to 518 can separate each of the gate structures into a number of portions. For example, the dielectric fin structures 512 and 514 separate the gate structure 520 into portions 520A, 520B, and 520C; and the dielectric fin structures 516 and 518 separate the gate structure 522 into portions 522A, 522B, and 522C. It should be understood that the layout 500 can include any number of each of the active regions, dielectric fin structures, and gate structures, while remaining within the scope of present disclosure. For example, the layout 500 does not necessarily have the same number of dielectric fin structures as the number of active regions, i.e., one or more of the active regions may not be separated by a dielectric fin structure.

The layout 500 further includes patterns 540, 542, 544, 546, and 548 that are each configured to form a metal structure (hereinafter "metal structure 540," "metal structure 542," "metal structure 544," "metal structure 546," and "metal structure 548," respectively). The metal structures 540 to 548 may extend along the first lateral direction (e.g., X-direction), with the metal structure 540 being the longest to have a length about the same as a length of the active regions (along the X-direction) and with the rest of metal structures 542 to 548 being shorter and offset from the metal structure 540 along the Y-direction.

In various embodiments, each of the active regions 504 to 508 is formed of a stack structure protruding from a major surface of a substrate. The stack includes a number of semiconductor nanostructures (e.g., nanosheets) extending along the X-direction and vertically separated from each other. Portions of the semiconductor structures in the stack that are overlaid by the gate structure remain, while other portions are replaced with a number of epitaxial structures.

The remaining portions of the semiconductor structures can be configured as the channel of a corresponding transistor (or sub-transistor), the epitaxial structures coupled to both sides (or ends) of the remaining portions of the semiconductor structures can be configured as source/drain structures (or terminals) of the transistor (or sub-transistor), and a portion of the gate structure that overlays (e.g., straddles) the remaining portions of the semiconductor structures can be configured as a gate structures (or terminal) of the transistor (or sub-transistor).

For example in FIG. 5, the portion of the active region 502A that is overlaid by the gate structure portion 520A may include a number of nanostructures vertically separated from each other, which can function as the channel of a sub-transistor 535. The portions of the active region 502A that are disposed on opposite sides of the gate structure portion 520A are replaced with epitaxial structures. Such epitaxial structures can function as source/drain terminals ("D" and "S" of FIG. 5) of sub-transistor 535. The gate structure portion 520A can function as a gate terminal ("G" of FIG. 5) of sub-transistor 535. Thus, it should be appreciated that the layout 500 can be used to fabricate a certain number of such sub-transistors. In some embodiments, such sub-transistors, formed based on the patterns 502-508 and 520-530, can be coupled to each other in parallel to collectively function as the access transistor of an efuse cell, and the metal structure 540 can function as the fuse resistor of the efuse cell.

Further, each of the dielectric fin structures 512 to 514 is formed to also protrude from the major surface of the substrate. Such a dielectric fin structure extends along a sidewall of each corresponding stack structure (extending along the X-direction), and thus, one sidewall of each semiconductor nanostructure of the sub-transistor channel (facing away or toward Y-direction) is in contact with the dielectric fin structure. Continuing with the same example above (sub-transistor 535), while being overlaid by the gate terminal (G), each of the nanostructures of the channel has a sidewall in contact with the dielectric fin structure 512. Specifically, each of the nanostructures has a top surface, a bottom surface, and four sidewalls. The top and bottom surfaces are wrapped by the gate terminal. Two of the sidewalls facing the X-direction are coupled to the source terminal (S) and drain terminal (D), respectively, one of the sidewalls facing away from the dielectric fin structure 512 is wrapped by the gate terminal, and one of the sidewalls facing toward the dielectric fin structure 512 is in contact with the dielectric fin structure 512, which will be discussed in detail as follows.

Figure 6A:
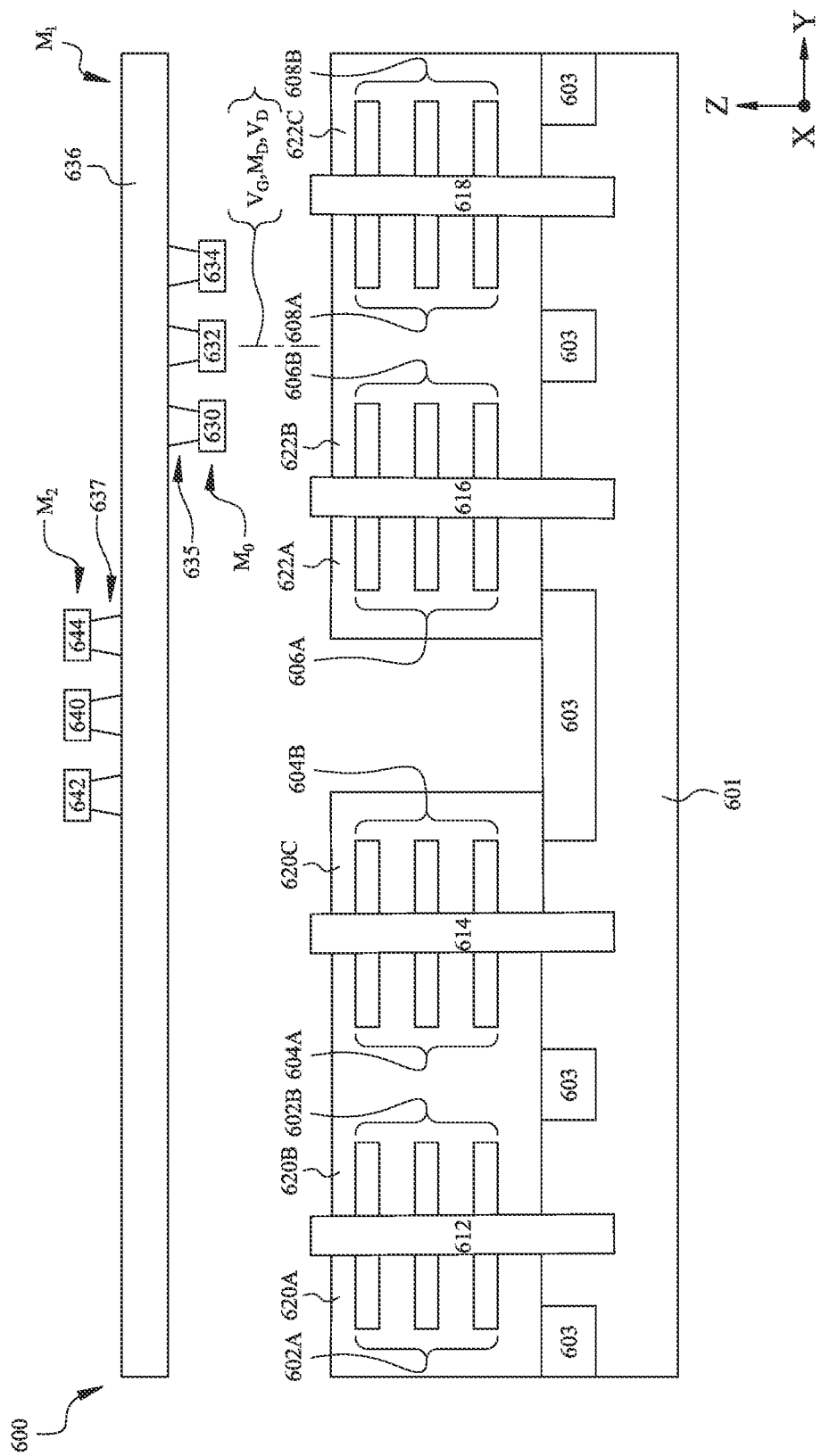
FIGS. 6A, 6B, and 6C illustrate various cross-sectional views of an example memory device fabricated based on the layout of FIG. 5, in accordance with some embodiments.
Figure 6B:
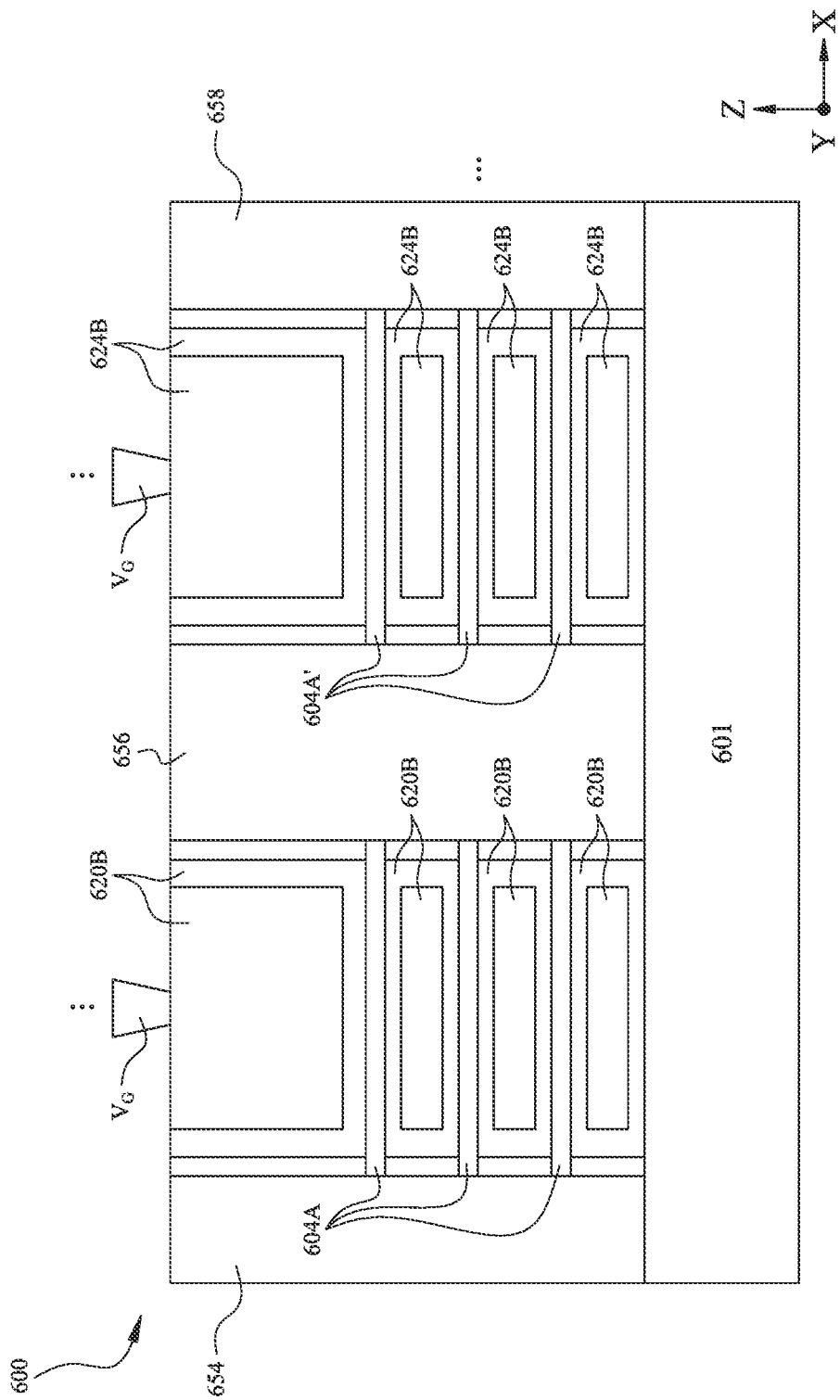
Figure 6C:
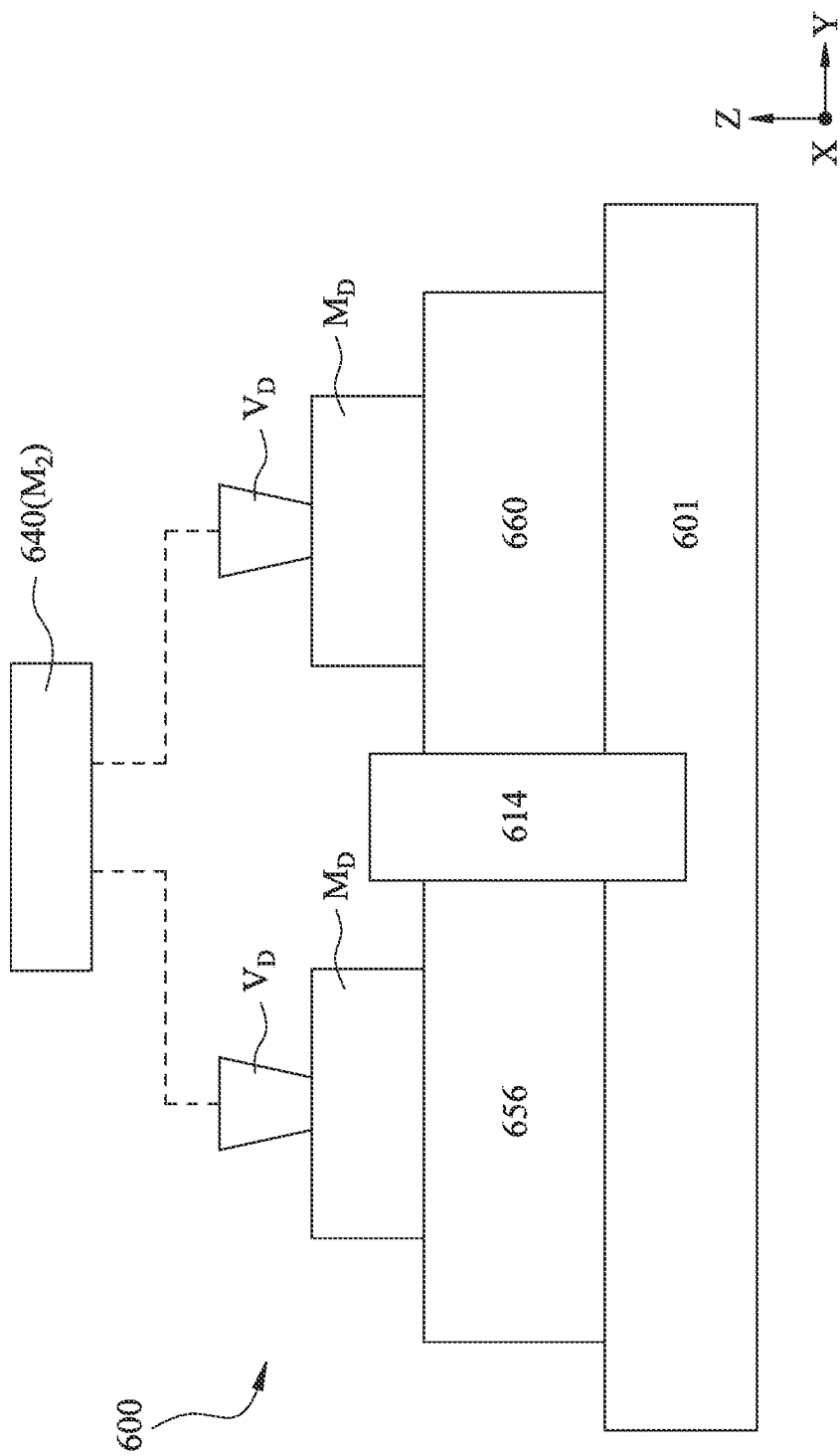

FIGS. 6A, 6B, and 6C illustrate various cross-sectional views of a memory device 600 fabricated based on the layout 500 of FIG. 5, in accordance with various embodiments. For example, FIG. 6A illustrates the cross-sectional view of a portion of the memory device 600 that is cut along the gate structures 520 and 522 (e.g., the lengthwise direction of a gate structure); FIG. 6B illustrates the cross-sectional view of a portion of the memory device 600 that is cut along the portion 504A across separated portions of the gate structures 520 and 524 (e.g., the lengthwise direction of an active region); and FIG. 6C illustrates the cross-sectional view of a portion of the memory device 600 that is cut across the portions 504A-B and dielectric fin structure 514 between the gate structures 520 and 524 (e.g., in parallel with the lengthwise direction of a gate structure).

Referring first to FIG. 6A, the memory device 600 includes a substrate 601 including a number of isolation regions (sometimes referred to as shallow trench isolation (STI) regions) 603 formed over a major surface of the substrate 601. Over the major surface, the memory device 600 includes plural sets of nanostructures, 602A, 602B, 604A, 604B, 606A, 606B, 608A, and 608B. Each set includes a number of nanostructures vertically separated from one another, as shown. In some embodiments, such sets of nanostructures 602A to 608B can be fabricated based on the patterns 502A to 508B of the layout 500 (FIG. 5), respectively. The memory device 600 includes (e.g., metal) gate structures 620A, 620B, 620C, 622A, 622B, and 622C, which can be fabricated based on the patterns 520A to 522C of the layout 500 (FIG. 5), respectively. The memory device 600 includes dielectric fin structures 612, 614, 616, and 618, which can be fabricated based on the patterns 512 to 518 of the layout 500 (FIG. 5), respectively.

As shown in the cross-sectional view of FIG. 6A, each nanostructure of the sets 602A to 608B has a top surface, a bottom surface, and a first sidewall (facing away or toward the Y-direction) wrapped by a corresponding gate structure, with a second sidewall (facing away or toward the Y-direction) contacting a corresponding dielectric fin structure. As such, two sets of the nanostructures, together with a corresponding dielectric fin structure, may form a fork, according to various embodiments. For example, the sets of nanostructures 602A and 602B, together with the dielectric fin structure 612, may form a first fork, the sets of nanostructures 604A and 604B, together with the dielectric fin structure 614, may form a second fork, and so on. Although the adjacent gate structures are separated by a dielectric fin structure in the illustrated embodiment of FIG. 6A, it should be noted that adjacent gate structures can straddle a dielectric fin structure interposed therebetween in some other embodiments.

Referring still to FIG. 6A, the memory device 600 includes a number of interconnect structures formed of, for example, one or more metal materials. Thus, such interconnect structures are sometimes referred to as metal structures. For example, the memory device 600 includes interconnect structures 630, 632, 634, 635, 636, 637, 642, 640, 644, 645, and 646. The interconnect structures 630 to 634 can be formed in a bottommost metallization layer (sometimes referred to as "M0"); the interconnect structure 636 can be formed in a next upper metallization layer (sometimes referred to as "M1"); the interconnect structures 635 are each formed as a via structure connecting respective interconnect structures in M0 and M1; the interconnect structures 642 to 644 can be formed in a further next upper metallization layer (sometimes referred to as "M2"); and the interconnect structures 637 are each formed as a via structure connecting respective interconnect structures in M1 and M2.

In some embodiments, the interconnect structures 630 to 634 in M0 may extend in the X-direction; the interconnect structure 636 in M1 may extend in the Y-direction; and the interconnect structures 642 to 644 in M2 may extend in the X-direction. In some embodiments, the interconnect structures 642 to 644 in M2 may be formed based on the patterns 542, 540, and 544 of layout 500 (FIG. 5), respectively. Such interconnect structures formed in or above the bottommost metallization layer M0 are generally referred to as "back-end-of-line (BEOL)" interconnect structures. Further, the memory device 600 includes a number of "middle-end-of-line (MEOL)" interconnect structures interposed between the bottommost metallization layer M0 and the transistor features (e.g., gate structures 620A-C) such as, for example, VG, MD, and VD, which will be better appreciated in FIGS. 6B-C.

Referring next to the cross-sectional view of FIG. 6B, the top surface and bottom surface of each nanostructure of set 604A are shown as being wrapped around by the gate structure 620B, which can include multiple layers, for example, a gate dielectric layer and a gate metal. Epitaxial structures 654 and 656, which respectively replace the portions of active region 504A on opposite sides of the gate structure 520B (FIG. 5), are disposed on (or coupled to) the opposite sides of each nanostructure of set 604A (along the X-direction).

As mentioned above, such features/structures (e.g., the set of nanostructures 604A, gate structure 620B, and epitaxial structures 654 and 656) can operatively function as a first one of the sub-transistors of the disclosed efuse cell. Along the X-direction (e.g., the direction in which the active region 504A extends), the memory device 600 further includes a number of similar features/structures. For example, the memory device 600 includes another set of nanostructures 604A', a gate structure 624B (formed based on a portion of the gate structure 524 of FIG. 5), and another epitaxial structure 658. The set of nanostructures 604A', gate structure 624B, and epitaxial structures 656 and 658 can operatively function as a second one of the sub-transistors of the disclosed efuse cell.

In some embodiments, these two sub-transistors may share the same epitaxial structure 656, functioning as their respective source terminals that are coupled to a source line (SL), with the epitaxial structure 654 functioning as the drain terminal of the first sub-transistor and the epitaxial structure 658 functioning as the drain terminal of the second sub-transistor. In general, the source terminals of the sub-transistors of a single efuse cell are commonly coupled to a SL with respective VDs and MDs, and the drain terminals of those sub-transistors are commonly coupled to a fuse resistor of that single efuse cell with respective VDs and MDs, that is, the sub-transistors of the efuse cell coupled to one another in parallel. Further, the gate terminals of those sub-transistors are commonly coupled to a word line (WL) with respective VGs. For example in FIG. 6B, the memory device 600 includes a number of VGs coupled to gate structures (gate terminals) 620B and 624B, respectively.

Referring then to the cross-sectional view of FIG. 6C, the dielectric fin structure 614 can further separate respective epitaxial structures of sub-transistors (e.g., along the Y-direction). For example, the dielectric fin structure 614 separates the epitaxial structure 656 (formed based on the active region 504A of FIG. 5) from the epitaxial structure 660 of another sub-transistor (formed based on the active region 504B of FIG. 5). As mentioned above, each epitaxial structure is coupled to a SL or a fuse resistor via corresponding MD and VD. In the illustrated example of FIG. 6C, the epitaxial structures 656 and 660, functioning as respective drain terminals of two of the sub-transistors, are coupled to the interconnect (metal) structure 640 in M2, which functions as the fuse resistor of the corresponding efuse cell.

With one end coupled to the drain terminals of the sub-transistors, referring again to FIG. 6A (and FIG. 5), the metal structure 640 has the other end coupled to a bit line (BL). Such a BL can be formed as an interconnect structure disposed in one of the metallization layers above M2. Within M2, the memory device 600 includes a number of metal structures (e.g., 642, 644) that are formed based on the patterns 542 to 548 of FIG. 5 and laterally adjacent the metal structure 640. In some embodiments, these M2 metal structures, except for the metal structure 640 functioning as the fuse resistor, may be floating (i.e., not forming a conduction path). For example, the BL formed in the upper metallization layer may be coupled to the M2 metal structures including the metal structures 640, 642, and 646 through via structures, respectively, but, except for the metal structure 640, other M2 metal structures may not be coupled to any transistor structures/terminals formed below (e.g., source terminals, drain terminals). With such "additional" via structures coupled to the floating metal structures, resistance values present on portions of a conduction (e.g., programming) path, other than on the metal structure 640, can be advantageously reduced. As such, the majority amount of a (e.g., voltage) signal applied on the programming path to burn down the metal structure 640 can be present (e.g., confined) between the ends of the metal structure 640, which can significantly increase programming yield of the efuse cell.

Figure 7:
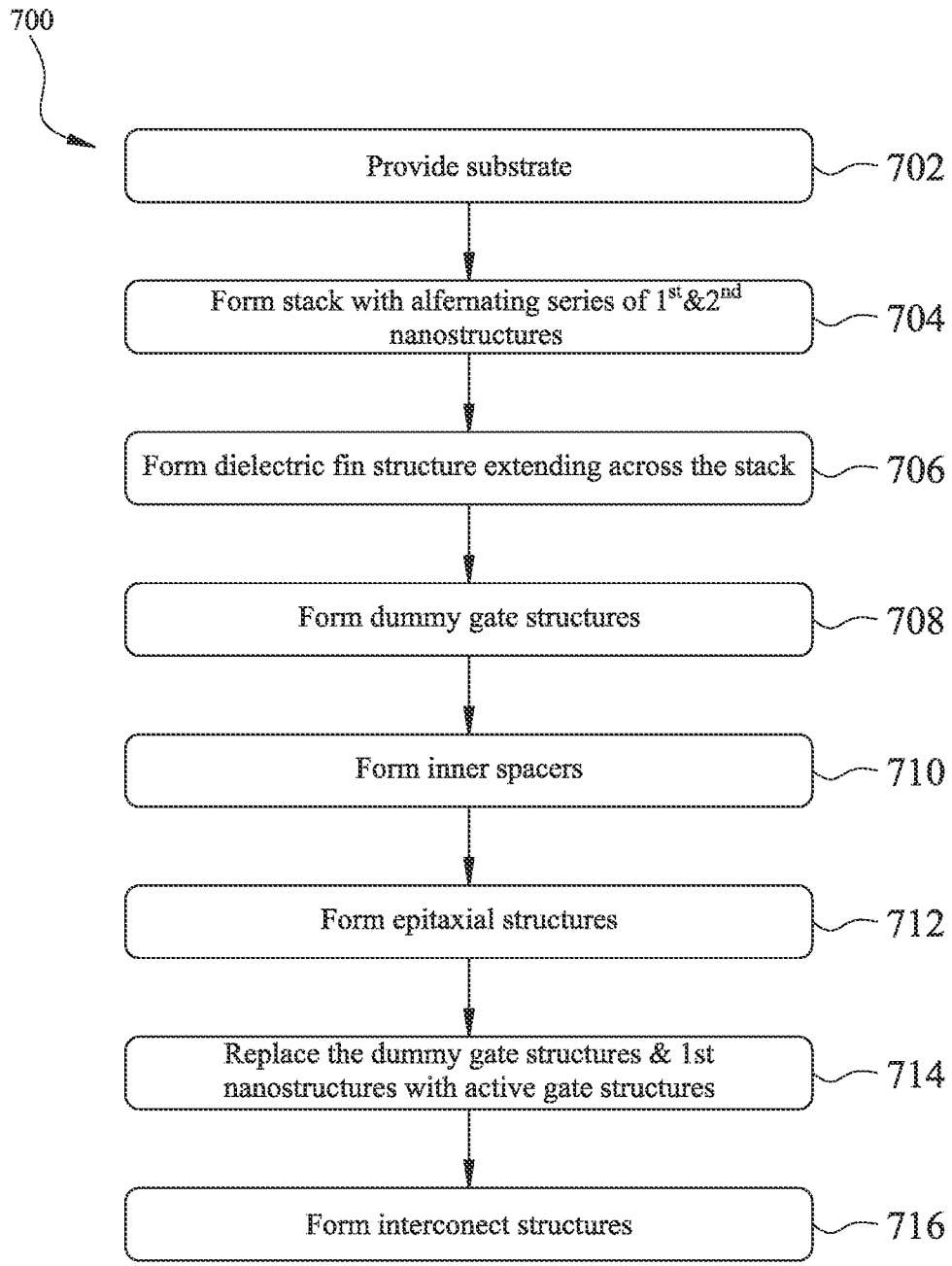
FIG. 7 illustrates a flow chart of a method for fabricating the memory device of FIGS. 6A-C, in accordance with some embodiments.

FIG. 7 illustrates a flowchart of a method 700 to form a portion of the above-described memory device 600, according to one or more embodiments of the present disclosure. For example, the method 700 includes operations to fabricate a number of sub-transistors of an efuse cell separated or otherwise isolated from each other with a dielectric fin structure (e.g., 612, 614, 616, 618). It is noted that the method 700 is merely an example and is not intended to limit the present disclosure. Accordingly, it is understood that additional operations may be provided before, during, and after the method 700 of FIG. 7, and that some other operations may only be briefly described herein.

The method 700 starts with operation 702 in which a substrate is provided, in accordance with various embodiments. The substrate includes a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

The method 700 proceeds to operation 704 in which a stack, including an alternating series of first nanostructures and second nanostructures, is formed, in accordance with various embodiments. Such a stack can be formed based on one of the (active region) patterns 502 to 508 of FIG. 5. In some embodiments, the first nanostructures may include SiGe sacrificial nanostructures, and the second nanostructures may include Si channel nanostructures. Such a stack may sometimes be referred to as a superlattice. In a non-limiting example, the SiGe sacrificial nanostructures can be SiGe 25%. The notation "SiGe 25%" is used to indicate that 25% of the SiGe material is Ge. It is understood the percentage of Ge in each of the SiGe sacrificial nanostructures can be any value between 0 and 100 (excluding 0 and 100), while remaining within the scope of present disclosure. In some other embodiments, the second nanostructures may include a first semiconductor material other than Si and the first nanostructures may include a second semiconductor material other than SiGe, as long as the first and second semiconductor materials are respectively characterized with different etching properties (e.g., etching rates).

The alternating series of nanostructures can be formed by epitaxially growing one layer and then the next until the desired number and desired thicknesses of the nanostructures are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The method 700 proceeds to operation 706 in which a dielectric fin structure is formed to extend across the stack, in accordance with various embodiments. Such a dielectric fin structure can be formed based on one of the (dielectric fin structure) patterns 512 to 518 of FIG. 5. The dielectric fin structure can extend along the same lengthwise direction as the stack. Further, the dielectric fin structure is formed around a middle portion of the stack, and thus, the dielectric fin structure can separate the stack into two portions that are on opposite sides of the dielectric fin structure along a direction perpendicular to the lengthwise direction of the dielectric fin structure (and the stack).

The dielectric fin structure can be formed by performing at least some of the following operations: etching the stack to form a recess traversing across the stack until a major surface of the substrate is exposed or to a certain depth below the major surface; depositing a dielectric material to at least fill up the recess; and optionally polishing the workpiece to remove the excessive dielectric material. In some embodiments, the dielectric material is formed of an insulation material, such as an isolation dielectric. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used.

The method 700 proceeds to operation 708 in which a number of dummy gate structures are formed, in accordance with various embodiments. Such a dummy gate structure can be formed based on one of the (gate structure) patterns 520 to 528 of FIG. 5. The dummy gate structure can extend along a direction perpendicular to the lengthwise direction of the dielectric fin structure (and the stack). Further, the dummy gate structure may be formed shorter than the dielectric fin structure in one of various embodiments, and thus, the dummy gate structure, as formed, is cut (or otherwise separated) by the dielectric fin structure.

The dummy gate structure can be formed by depositing amorphous silicon (a-Si) over the stack. Other materials suitable for forming dummy gates (e.g., polysilicon) can be used while remaining within the scope of present disclosure. The a-Si is then planarized to a desired level. A hard mask is deposited over the planarized a-Si and patterned. The hard mask can be formed from a nitride or an oxide layer. An etching process (e.g., a reactive-ion etching (ME) process) is applied to the a-Si to form the dummy gate structure. After forming the dummy gate structure, gate spacers may be formed to extend along sidewalls of the dummy gate structure. The gate spacers can be formed by a conformal deposition of a dielectric material (e.g., silicon oxide, silicon nitride, silicon oxynitride, SiBCN, SiOCN, SiOC, or any suitable combination of those materials) followed by a directional etch (e.g., ME).

The method 700 proceeds to operation 710 in which inner spacers are formed by replacing end portions of each of the SiGe sacrificial nanostructures with a dielectric material, in accordance with various embodiments. Upon forming the dummy gate structure overlaying certain portions of the stack (e.g., the portions of the stack separated by the dielectric fin struture), the non-overlaid portions of the stack are removed. Next, respective end portions of each SiGe sacrificial nanostructure of the overlaid stack are removed. The inner spacers are formed by filling such recesses of each SiGe sacrificial nanostructure with a dielectric material by chemical vapor deposition (CVD), or by monolayer doping (MLD) of nitride followed by spacer ME. A material of the inner spacers can be formed from the same or different material as the gate spacers described above. For example, the inner spacers can be formed of silicon nitride, silicoboron carbonitride, silicon carbonitride, silicon carbon oxynitride, or any other type of dielectric material (e.g., a dielectric material having a dielectric constant k of less than about 5).

The method 700 proceeds to operation 712 in which a number of epitaxial structures are formed, in accordance with various embodiments. Upon forming the inner spacers, the epitaxial structures are formed using an epitaxial layer growth process on exposed ends of the Si nanostructures. In-situ doping (ISD) may be applied to form doped epitaxial structures, thereby creating the necessary junctions for a corresponding transistor (or sub-transistor). N-type and p-type FETs are formed by implanting different types of dopants to selected regions of the device to form the necessary junction(s). N-type devices can be formed by implanting arsenic (As) or phosphorous (P), and p-type devices can be formed by implanting boron (B). After forming the epitaxial structures, an inter-layer dielectric (e.g., silicon dioxide) is deposited to overlay the epitaxial structures.

The method 700 proceeds to operation 714 in which the dummy gate structures and the remaining SiGe sacrificial nanostructures are replaced with respective active gate structures, in accordance with various embodiments. Subsequently to forming the inter-layer dielectric, the dummy gate structures are removed by an etching process, e.g., RIE or chemical oxide removal (COR). Next, the remaining SiGe sacrificial nanostructures are removed while keeping the Si channel nanostructure substantially intact by applying a selective etch (e.g., a hydrochloric acid (HCl)). After the removal of the SiGe sacrificial nanostructures, top and bottom surfaces and sidewalls of each of the Si channel nanostructures can be exposed, except for the sidewall in contact with the dielectric fin structure. Next, a number of active gate structures can be formed to wrap around each of the Si channel nanostructures, except for the sidewall contacting the dielectric fin structure. Each of the active gate structures includes at least a gate dielectric layer (e.g., a high-k dielectric layer) and a gate metal layer (e.g., a work function metal layer). Upon the active gate structures are formed, a number of sub-transistors of the disclosed efuse cell can be formed.

The method 700 proceeds to operation 716 in which a number of interconnect structures are formed, in accordance with various embodiments. Upon forming the sub-transistors, a number of interconnect structures, one of which is configured as a fuse resistor of the efuse cell, are formed over the sub-transistors. As discussed above, the interconnect structure functioning as the fuse resistor may be formed in M2 metallization layer, with one end coupled to drain terminals of the underlying sub-transistors and the other end coupled to a BL disposed thereon. However, it should be understood that the fuse resistor can be formed as an interconnect structure in any of the metallization layers, while remaining within the scope of present disclosure. The interconnect structure is formed of a metal material. The metal material can be at least one of: aluminum, tungsten, tungsten nitride, copper, cobalt, silver, gold, chrome, ruthenium, platinum, titanium, titanium nitride, tantalum, tantalum nitride, or nickel, hafnium. Other metal materials are within the scope of the present disclosure. The interconnect structures can be formed by overlaying the workpiece with the above-listed metal material by, for example, chemical vapor deposition (CVD), physical vapor deposition (PVD), electroless plating, electroplating, or combinations thereof.

In one aspect of the present disclosure, a semiconductor device is disclosed. The semiconductor device includes a plurality of first nanostructures extending along a first lateral direction. The semiconductor device includes a first epitaxial structure and second epitaxial structure respectively coupled to ends of each of the plurality of first nanostructures along the first lateral direction. The semiconductor device includes a dielectric fin structure disposed immediately next to a sidewall of each of the plurality of first nanostructures facing a second lateral direction perpendicular to the first lateral direction. The semiconductor device includes a first gate structure wrapping around each of the plurality of first nanostructures except for the sidewalls of the first nanostructures. The semiconductor device includes a metal structure disposed above the first gate structure and coupled to one of the first or second epitaxial structure.

In another aspect of the present disclosure, a memory device is disclosed. The memory device includes a plurality of memory cells, each one of which includes a first transistor and a resistor operatively coupled to each other in series. The first transistor includes a first channel structure including a plurality of first nanostructures; a first source/drain structure coupled to a first sidewall of each of the plurality of first nanostructures; and a first gate structure coupled to a top surface, a bottom surface, and a second sidewall of each of the plurality of first nanostructures, with a third sidewall coupled to a dielectric fin structure. The resistor includes a metal structure disposed above the first gate structure.

In yet another aspect of the present disclosure, a method for fabricating a memory device is disclosed. The method includes forming a plurality of first nanostructures and a plurality of second nanostructures separated by a dielectric fin structure. Each of the plurality of first nanostructures, each of the plurality of second nanostructures, and the dielectric fin structure extend along a first lateral direction. The method includes forming a first gate structure wrapping around each of the first nanostructures except for a sidewall that is in contact with the dielectric fin structure. The method includes forming a second gate structure wrapping around each of the second nanostructures except for a sidewall that is in contact with the dielectric fin structure. The first and second gate structures extend along a second lateral direction perpendicular to the first lateral direction. The method includes forming a first metal structure above the first and second gate structures, wherein the first metal structure is electrically coupled to first nanostructures. The method includes forming a second metal structure above the first and second gate structures, wherein the second metal structure is electrically coupled to second nanostructures.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of first nanostructures extending along a first lateral direction;

a first epitaxial structure and second epitaxial structure respectively coupled to ends of each of the plurality of first nanostructures along the first lateral direction;

a dielectric fin structure disposed immediately next to a sidewall of each of the plurality of first nanostructures facing a second lateral direction perpendicular to the first lateral direction;

a first gate structure wrapping around each of the plurality of first nanostructures except for the sidewall that is immediately next to the dielectric fin; and a metal structure disposed above the first gate structure and coupled to one of the first or second epitaxial structure.

2. The semiconductor device of claim 1, wherein the metal structure extends along the first lateral direction.

3. The semiconductor device of claim 1, wherein the dielectric fin structure extends along the first lateral direction.

4. The semiconductor device of claim 1, wherein the first gate structure extends along the second lateral direction.

5. The semiconductor device of claim 1, wherein the plurality of first nanostructures, the first and second epitaxial structures, and the first gate structure collectively form a first transistor, and the metal structure forms a first resistor.

6. The semiconductor device of claim 5, wherein the first transistor and first resistor are coupled to each other in series.

7. The semiconductor device of claim 6, wherein the serially coupled first transistor and first resistor collectively function as a first one-time-programmable memory cell.

8. The semiconductor device of claim 7, further comprising:
a plurality of second nanostructures extending along the first lateral direction;
a third epitaxial structure and fourth epitaxial structure respectively coupled to ends of each of the plurality of second nanostructures along the first lateral direction, wherein the dielectric fin structure is disposed immediately next to a sidewall of each of the plurality of second nanostructures along the second lateral direction; and
a second gate structure wrapping around each of the plurality of second nanostructures except for the sidewalls of the second nanostructures.

9. The semiconductor device of claim 8, wherein the plurality of second nanostructures, the third and fourth epitaxial structures, and the second gate structure collectively form a second transistor, and wherein the second transistor is electrically coupled to the first transistor in parallel.

10. The semiconductor device of claim 8, wherein the first gate structure and second gate structure are aligned with each other along the second lateral direction.

11. A memory device, comprising:
a plurality of memory cells, each one of which includes a first transistor and a resistor operatively coupled to each other in series;
wherein the first transistor includes:
a first channel structure including a plurality of first nanostructures;
a first source/drain structure coupled to a first sidewall of each of the plurality of first nanostructures; and
a first gate structure coupled to a top surface, a bottom surface, and a second sidewall of each of the plurality of first nanostructures, with a third sidewall of the first nanostructures coupled to a dielectric fin structure; and wherein the resistor includes:
a metal structure disposed above the first gate structure.

12. The memory device of claim 11, wherein the third sidewall is opposite to the second sidewall, and the first sidewall is perpendicular to each of the second and third sidewalls.

13. The memory device of claim 11, wherein the metal structure is electrically coupled to the first source/drain structure.

14. The memory device of claim 11, wherein the plurality of memory cells each include an electrical fuse.

15. The memory device of claim 11, wherein the first metal structure and each of the plurality of first nanostructures extend along a same direction.

16. The memory device of claim 11, wherein the memory cell further includes a second transistor operatively coupled to the first transistor in parallel and also operatively coupled to the resistor in series;
wherein the second transistor includes:
a second channel structure including a plurality of second nanostructures;
a second source/drain structure coupled to a first sidewall of each of the plurality of second nanostructures;
a second gate structure coupled to a top surface, a bottom surface, and a second sidewall of each of the plurality of second nanostructures, with a third sidewall coupled to the dielectric fin structure.

17. The memory device of claim 16, wherein the first and second gate structures are separated by the dielectric fin structure.

18. A method for fabricating a memory device, comprising:
forming a plurality of first nanostructures and a plurality of second nanostructures separated by a dielectric fin structure, wherein each of the plurality of first nanostructures, each of the plurality of second nanostructures, and the dielectric fin structure extend along a first lateral direction;
forming a first gate structure wrapping around each of the first nanostructures except for a sidewall that is in contact with the dielectric fin structure;
forming a second gate structure wrapping around each of the second nanostructures except for a sidewall that is in contact with the dielectric fin structure, wherein the first and second gate structures extend along a second lateral direction perpendicular to the first lateral direction;
forming a first metal structure above the first and second gate structures, wherein the first metal structure is electrically coupled to first nanostructures; and
forming a second metal structure above the first and second gate structures, wherein the second metal structure is electrically coupled to second nanostructures.

19. The method of claim 18, further comprising:
forming a first epitaxial structure coupled to an end of each of the first nanostructures along the first lateral direction, wherein the first metal structure is electrically coupled to the first nanostructures through the first epitaxial structure; and
forming a second epitaxial structure coupled to an end of each of the second nanostructures along the first lateral direction, wherein the second metal structure is electrically coupled to the second nanostructures through the second epitaxial structure.

20. The method of claim 18, wherein the first and second gate structures, separated apart by the dielectric fin structure, are aligned with each other along the second lateral direction.

* * * * *